(12) United States Patent
Taniguchi

(10) Patent No.: US 8,026,778 B2
(45) Date of Patent: Sep. 27, 2011

(54) LC COMPOSITE COMPONENT

(75) Inventor: Tetsuo Taniguchi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 217 days.

(21) Appl. No.: 12/499,161

(22) Filed: Jul. 8, 2009

(65) Prior Publication Data

US 2010/0007437 A1    Jan. 14, 2010

(30) Foreign Application Priority Data

Jul. 10, 2008    (JP) .................. 2008-179883

(51) Int. Cl.
*H03H 7/01* (2006.01)
*H03H 7/09* (2006.01)

(52) U.S. Cl. ...................... 333/185; 333/175

(58) Field of Classification Search ............. 333/175, 333/177, 185, 204
See application file for complete search history.

(56) References Cited

U.S. PATENT DOCUMENTS

| | | | |
|---|---|---|---|
| 5,404,118 A | 4/1995 | Okamura et al. | |
| 5,815,367 A * | 9/1998 | Asakura et al. | 361/303 |
| 5,955,931 A | 9/1999 | Kaneko et al. | |
| 6,115,234 A | 9/2000 | Ishii et al. | |
| 6,417,745 B1 * | 7/2002 | Taniguchi | 333/185 |
| 6,437,665 B1 | 8/2002 | Kato | |
| 6,583,687 B2 * | 6/2003 | Nosaka | 333/175 |
| 2002/0030563 A1 | 3/2002 | Nosaka et al. | |
| 2002/0101303 A1 | 8/2002 | Tojyo | |
| 2007/0241839 A1 * | 10/2007 | Taniguchi | 333/185 |

FOREIGN PATENT DOCUMENTS

| | | |
|---|---|---|
| JP | 57-193011 A | 11/1982 |
| JP | 03-004507 A | 1/1991 |
| JP | 05-036532 A | 2/1993 |
| JP | 06-053704 A | 2/1994 |
| JP | 06-244605 A | 9/1994 |
| JP | 07-029738 A | 1/1995 |
| JP | 08-018376 A | 1/1996 |
| JP | 08-148354 A | 6/1996 |
| JP | 08-191201 A | 7/1996 |
| JP | 08-237060 A | 9/1996 |
| JP | 08-316035 A | 11/1996 |

(Continued)

OTHER PUBLICATIONS

Official Communication issued in corresponding Japanese Patent Application No. 2008-179883, mailed on Apr. 20, 2010.

*Primary Examiner* — Seungsook Ham
(74) *Attorney, Agent, or Firm* — Keating & Bennett, LLP

(57) ABSTRACT

An LC composite component capable of reducing an overall size while keeping a Q-value of a resonator at a high level and increasing coupling flexibility of resonators includes two capacitor electrodes and two input/output terminal electrodes extending therefrom provided on a first dielectric layer. A ground electrode and another capacitor electrode are provided on second and sixth dielectric layers, respectively. Two substantially linear line electrodes are provided on a third dielectric layer. Two substantially U-shaped line electrodes are provided on a fourth dielectric layer. Two substantially crank-shaped line electrodes are provided on a fifth dielectric layer. Six via electrodes arranged to connect ends of respective line electrodes are provided on the third, fourth, and fifth dielectric layers. These via electrodes and line electrodes constitute electrodes of a double helix structure.

10 Claims, 11 Drawing Sheets

FOREIGN PATENT DOCUMENTS

| | | |
|---|---|---|
| JP | 10-013180 A | 1/1998 |
| JP | 10-241990 A | 9/1998 |
| JP | 11-097963 A | 4/1999 |
| JP | 2000-077911 A | 3/2000 |
| JP | 2000-323901 A | 11/2000 |
| JP | 2002-043881 A | 2/2002 |
| JP | 2002-076704 A | 3/2002 |
| JP | 2003-318028 A | 11/2003 |
| JP | 2007-235778 A | 9/2007 |
| WO | 2006/022098 A1 | 3/2006 |

* cited by examiner

LC COMPOSITE COMPONENT

BACKGROUND OF THE INVENTION

1. Field of the Invention

The present invention relates to an inductor-capacitor (LC) composite component, such as, for example, a bandpass filter, that includes an inductor and a capacitor in a multilayer body of a plurality of dielectric layers.

2. Description of the Related Art

Japanese Unexamined Patent Application Publication No. 6-244605 discloses a bandpass filter having helical coils in a dielectric multilayer body.

A configuration of a multilayer bandpass filter disclosed in Japanese Unexamined Patent Application Publication No. 6-244605 will be described with reference to FIG. 1.

Referring to FIG. 1, substantially U-shaped conductor patterns P are formed on a surface of a dielectric green sheet G by screen printing. There are two arrangement states of the conductor patterns P. One is a state where openings of the U-shape face each other, whereas the other is a state where sides of the U-shape, opposite to the opening, face each other. The dielectric green sheets G having one of these two arrangement states of the conductor patterns P and having the other arrangement state are alternately laminated.

The conductor patterns P formed on the upper and lower dielectric green sheets G by printing are connected through via electrodes V1 and V2.

When viewed from one principal plane of a multilayer substrate, this bandpass filter is configured so that two coil electrodes form helices at different positions. The two neighboring coil electrodes are coupled through a magnetic field.

However, since two coil electrodes are arranged side by side in a bandpass filter disclosed in Japanese Unexamined Patent Application Publication No. 6-244605, the surface-direction size of a multilayer substrate undesirably increase. In addition, since the coil electrodes are arranged side by side in the horizontal direction, coupling as strong as that obtained by arranging the coil electrodes to touch each other may not be obtained although the coupling therebetween can be increased by decreasing the horizontal distance therebetween.

SUMMARY OF THE INVENTION

Preferred embodiments of the present invention provide an LC composite component capable of reducing the entire size while keeping a Q-value of resonators at a high level and increasing coupling flexibility between resonators.

To overcome the above-described disadvantages, an LC composite component according to a preferred embodiment of the present invention is configured in the following manner.

The LC composite component includes a multilayer substrate of a plurality of dielectric layers, at least two input/output terminal electrodes disposed in the multilayer substrate, a ground terminal electrode disposed in the multilayer substrate, and an LC resonant circuit, disposed in the multilayer substrate, that includes two inductors whose one ends are connected to the respective input/output terminal electrodes and a capacitor whose one end is connected to the input/output terminal electrode. The two inductors preferably include line electrodes provided on the plurality of dielectric layers of the multilayer substrate and via electrodes to connect the line electrodes neighboring in a lamination direction of the plurality of dielectric layers, and include two helical electrodes that have the lamination direction of the multilayer substrate as a central axis. The two helical electrodes are arranged so that one of the helical electrodes overlaps the other helical electrode at least partially when the multilayer substrate is viewed in the lamination direction.

With such a configuration, an occupied area can be reduced by overlapping arrangement areas of the two inductors and the entire size can be reduced without decreasing a Q-value of a resonator. That is, the Q-value for the size of the resonator can be increased.

In addition, since a gap between the line electrodes of the two helical electrodes is reduced and closed magnetic circuits of the two inductors are shared, mutual inductance is increased. Furthermore, since electrodes having a small potential difference are arranged side by side in the same plane, parasitic capacitance between the line electrodes of the helical electrodes can be suppressed and minimized. In this manner, a settable range of coupling of the two inductors broadens and design flexibility improves.

The central axis of a helix of the one of the helical electrodes and the central axis of a helix of the other helical electrode may be located at substantially the same position.

With such a configuration, since an overlapping area (opening portion) of the two helical electrodes becomes the broadest, magnetic flux is more likely to pass through the opening portion and a Q-value of the inductor becomes high. Accordingly, a resonator having a high Q-value is obtained.

Winding directions of the two helical electrodes may be the same when positions of the two input/output terminal electrodes are set as starting points.

With such a configuration, the direction of magnetic fields generated by the two inductors can be set to the same direction and magnetic coupling of the two inductors can be increased.

The line electrodes that are part of the two helical electrodes formed on the plurality of dielectric layers of the multilayer substrate may be arranged to be rotationally symmetric to the central axis in each layer.

With such a configuration, the electrodes neighboring in the lamination direction have different shapes and swelling of the multilayer substrate due to concentration of electrodes can be advantageously prevented.

A ground electrode to be connected to the ground terminal electrode may be provided in the multilayer substrate and the other ends of the two helical electrodes may be connected to the same ground electrode.

With such a configuration, since the ground electrode is defined by a single broad electrode, unnecessary parasitic inductance is not caused at the ground electrode. Accordingly, an inductance value can be stabilized and deterioration of a characteristic can be prevented. In addition, since the size of the ground electrode becomes larger, a high Q-value corresponding to the size is obtained.

The capacitor may have a capacitor electrode that extends over a range covering at least a major portion of a formation area of the helical electrodes when the multilayer substrate is viewed in the lamination direction. The capacitor electrode and the ground electrode may be arranged to sandwich the helical electrodes in the lamination direction.

With such a configuration, spreading of magnetic flux due to the helical electrodes (inductors) can be suppressed and minimized by the ground electrode and unnecessary magnetic coupling with a circuit on a mounting-board side can be prevented.

The capacitor may be connected in series with the input/output terminal electrodes. An electrode for constituting the capacitor may be provided at the highest and/or lowest layer of electrode-forming layers of the multilayer substrate in the lamination direction.

With such a configuration, spreading of magnetic flux due to the helical electrodes (inductors) can be suppressed and minimized by the ground electrode and unnecessary magnetic coupling with a circuit on a mounting-board side can be prevented.

The helical electrodes may have partial electrodes provided on a plurality of dielectric layers of the multilayer substrate. Widths of the partial electrodes neighboring in the lamination direction of the multilayer substrate may differ.

With such a configuration, since a facing area of the line electrodes neighboring in the lamination direction can be kept substantially constant even if surface-direction displacement is caused between the line electrodes neighboring in the lamination direction (lamination displacement of the dielectric layers), the characteristic can be stabilized.

Thickness of at least one of the plurality of dielectric layers having the via electrodes serving as a portion of the helical electrodes provided thereon may be made thicker than thickness of other dielectric layers not having the via electrodes provided thereon.

The cross-section of the via electrode is larger than that of the line electrode. Accordingly, by increasing the length of the via electrode and reducing the length of the line electrode by the increased amount of the length of the via electrode, a high Q-value can be obtained.

Thickness of a dielectric layer having a via electrode to be connected to the ground electrode among the via electrodes serving as a portion of the helical electrodes may be made thicker than thickness of a dielectric layer having the other via electrodes formed thereon.

With such a configuration, electromagnetic coupling between the inductor and the ground electrode can be suppressed and minimized and a resonator having a high Q-value can be obtained.

According to a preferred embodiment of the present invention, it is possible to reduce an occupied area by overlapping arrangement areas of two inductors and to reduce the entire size without decreasing the Q-value of a resonator. That is, the Q-value for the size of the resonator can be increased.

Additionally, since a gap between line electrodes of two helical electrodes is reduced and closed magnetic circuits of two inductors are shared, mutual inductance is increased. Furthermore, since electrodes having a small potential difference are arranged side by side, parasitic capacitance between line electrodes of the helical electrodes can be suppressed and minimized. In this manner, a settable range of coupling of the two inductors broadens and design flexibility improves.

Other features, elements, steps, characteristics and advantages of the present invention will become more apparent from the following detailed description of preferred embodiments of the present invention (with reference to the attached drawings).

DETAILED DESCRIPTION OF THE PREFERRED EMBODIMENTS

First Preferred Embodiment

A multilayer bandpass filter according to a first preferred embodiment will be described with reference to FIGS. 2-5.

Figure 1:
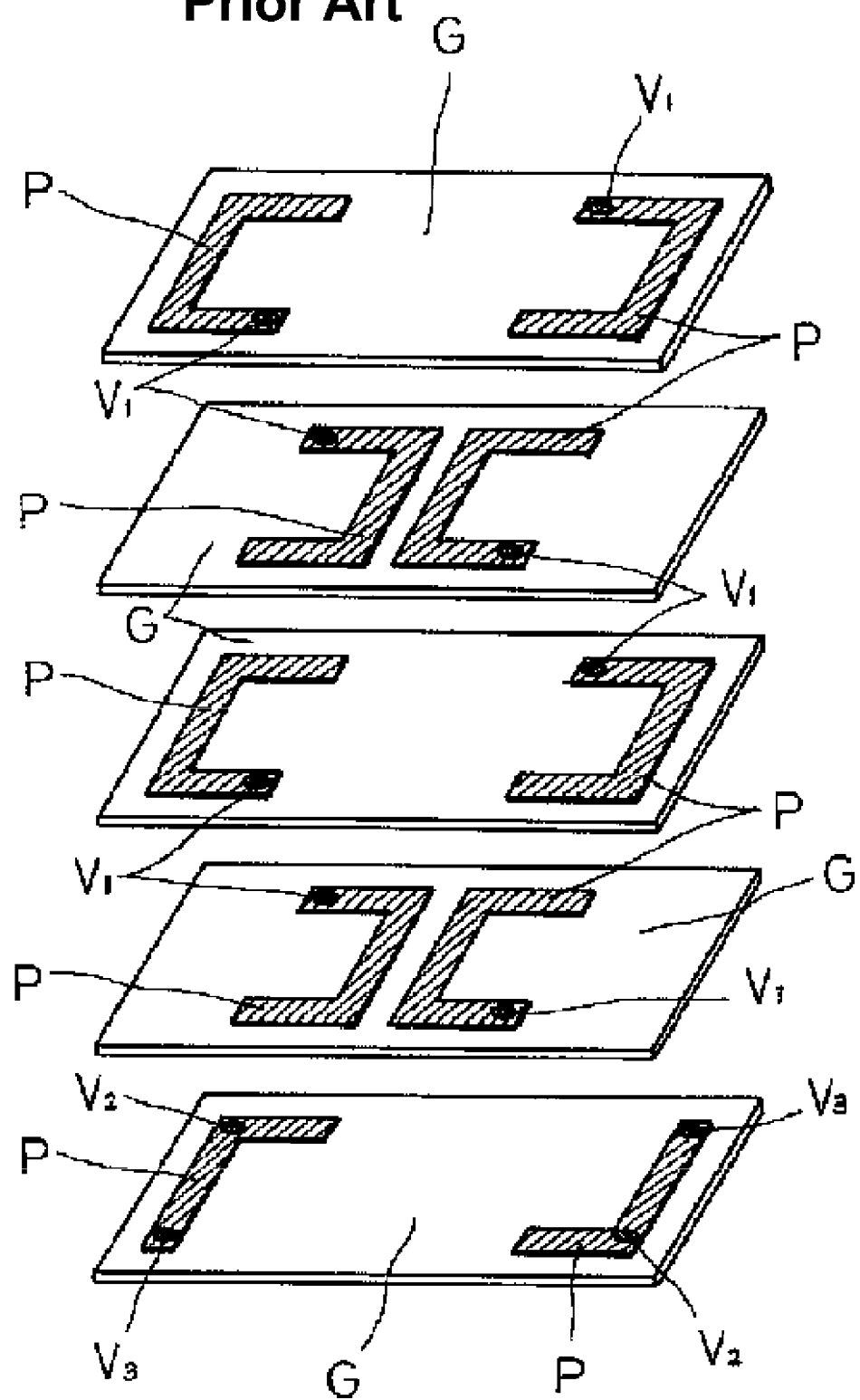
FIG. 1 is an exploded perspective view of a multilayer bandpass filter disclosed in Japanese Unexamined Patent Application Publication No. 6-244605.
Figure 2:
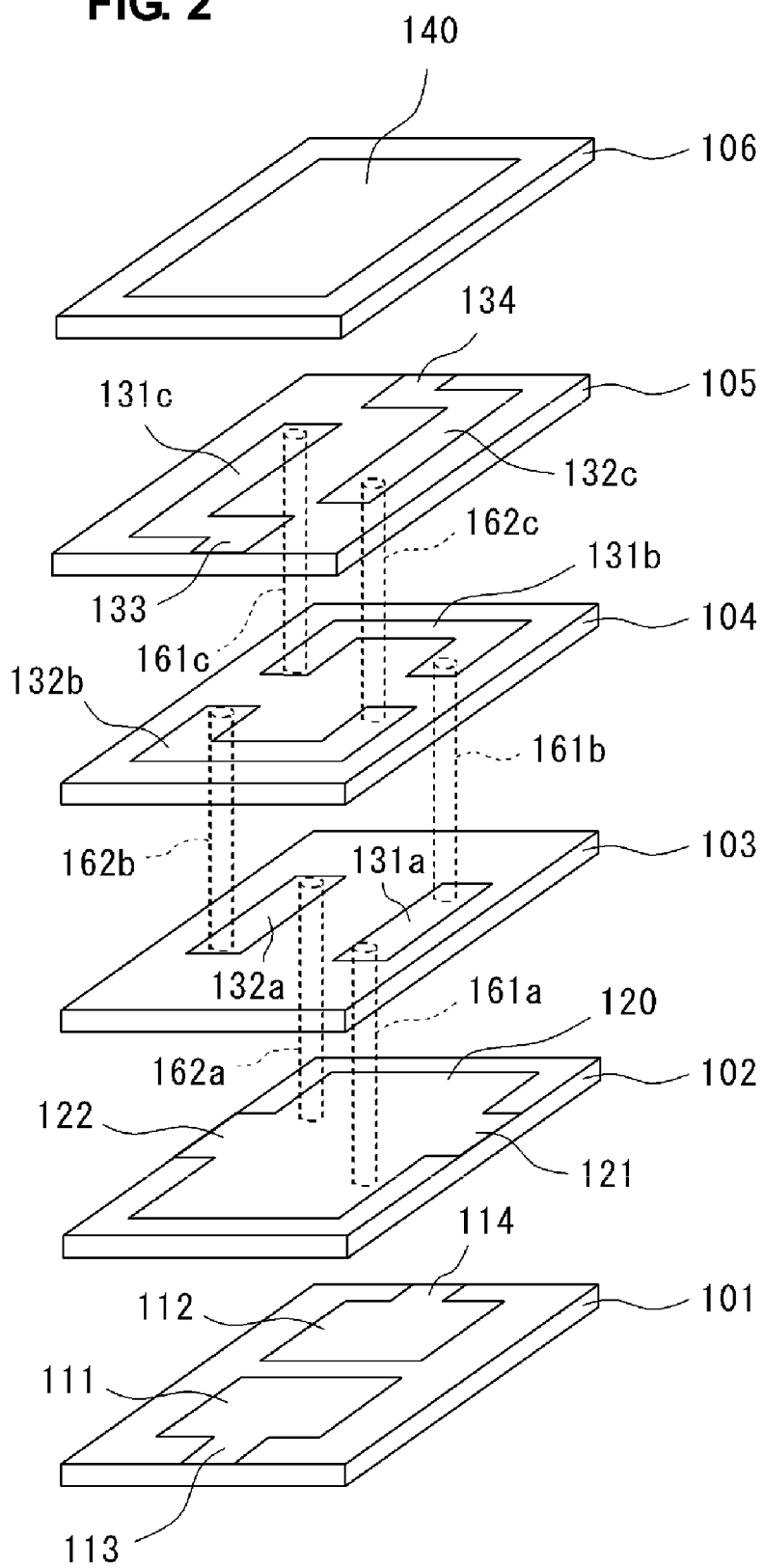
FIG. 2 is an exploded perspective view of a multilayer bandpass filter according to a first preferred embodiment of the present invention.
Figure 3:
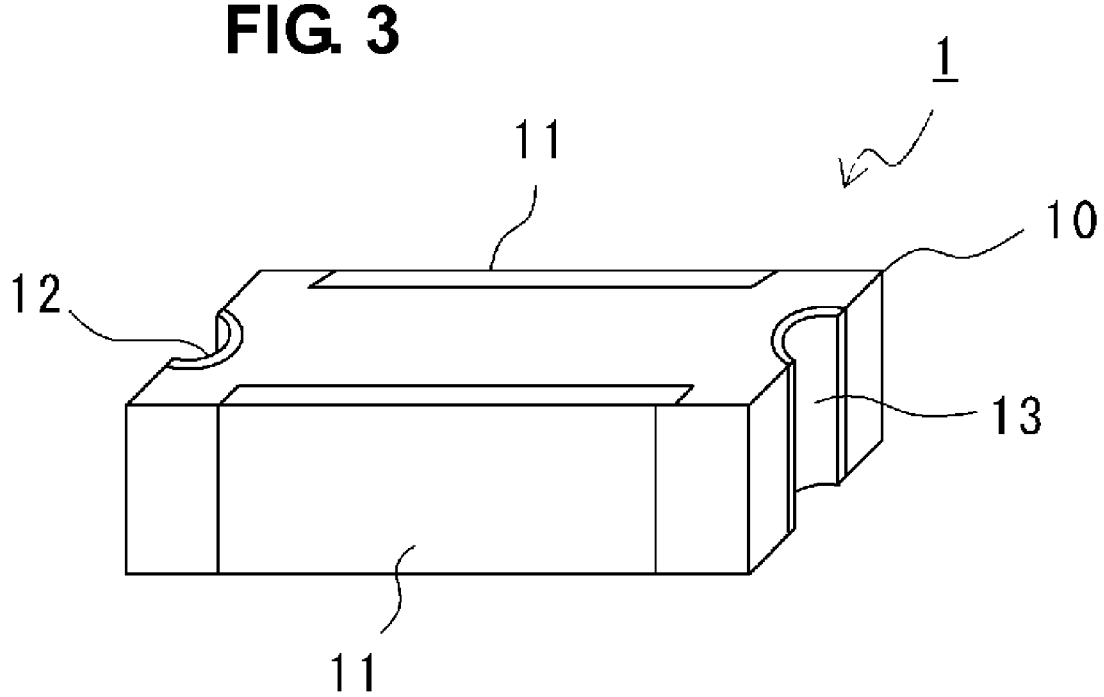
FIG. 3 is a perspective view of a multilayer bandpass filter according to a first preferred embodiment of the present invention.

FIG. 2 is an exploded perspective view of a multilayer bandpass filter according to the first preferred embodiment, whereas FIG. 3 is a perspective view thereof.

A multilayer bandpass filter 1 according to the first preferred embodiment includes a plurality of laminated dielectric layers 101-106 having various electrode patterns provided thereon. For example, the size of the multilayer bandpass filter 1 shown in FIG. 3 preferably is substantially 1.0 mm×0.5 mm and the height thereof is substantially 0.4 mm.

Each of the dielectric layers 101-106 is a dielectric sheet formed of LTCC (low temperature co-fired ceramics that is formed of a glass component and at least one of components, such as, for example, titanium oxide, barium oxide, and alumina) having a relative dielectric constant $\varepsilon_r=53.5$, for example.

As shown in FIG. 3, ground terminals 11 and input/output terminals 12 and 13 are formed at lateral surfaces of a multilayer substrate 10.

Since a perspective view of a multilayer bandpass filter according to second and following preferred embodiments is the same as that of the multilayer bandpass filter shown in FIG. 3, this diagram is commonly used in each of the second and following preferred embodiments.

As shown in FIG. 2, capacitor electrodes 111 and 112 and input/output terminal electrodes 113 and 114 extending from the capacitor electrodes 111 and 112, respectively, are provided on the dielectric layer 101.

A ground electrode 120 is provided on the dielectric layer 102.

A capacitor electrode 140 is provided on the dielectric layer 106.

Line electrodes and via electrodes that constitute two helical electrodes are provided on the dielectric layers 103-105. More specifically, substantially linear line electrodes 131a and 132a are provided on the dielectric layer 103. Substantially U-shaped line electrodes 131b and 132b are provided on the dielectric layer 104. Substantially crank-shaped or L-shaped line electrodes 131c and 132c are provided on the dielectric layer 105. Via electrodes 161a and 162a arranged to connect the ground electrode 120 and one ends of the line electrodes 131a and 132a, respectively, are disposed on the dielectric layer 103. Additionally, via electrodes 161b and 162b arranged to connect the other ends of the line electrodes 131a and 132a and one ends of the line electrodes 131b and 132b, respectively, are provided on the dielectric layer 104. Furthermore, via electrodes 161c and 162c arranged to connect the other ends of the line electrodes 131b and 132b and one ends of the line electrodes 131c and 132c, respectively, are provided on the dielectric layer 105.

Figure 4A:
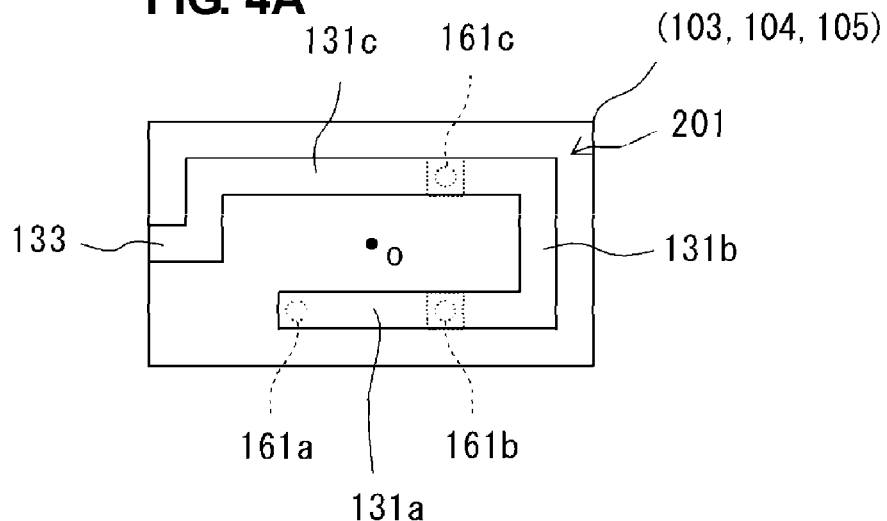
FIGS. 4A-4C are plan views showing a configuration of helical electrodes when dielectric layers 103, 104, and 105 shown in FIG. 2 are laminated.
Figure 4B:
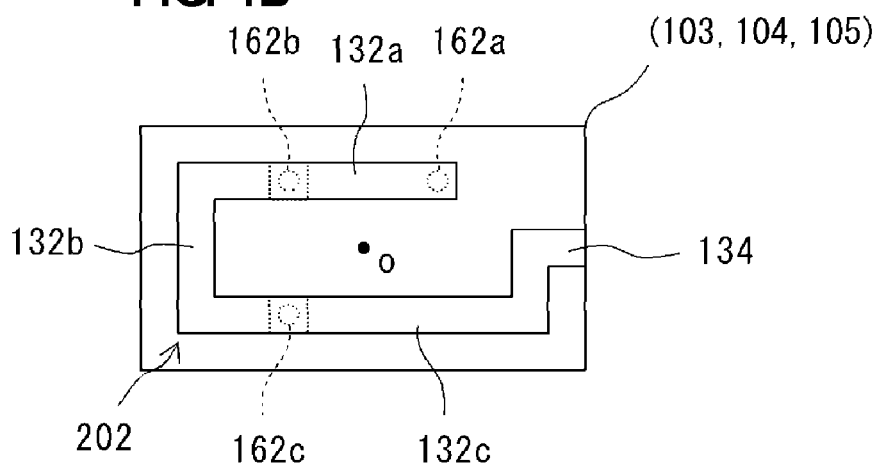
Figure 4C:
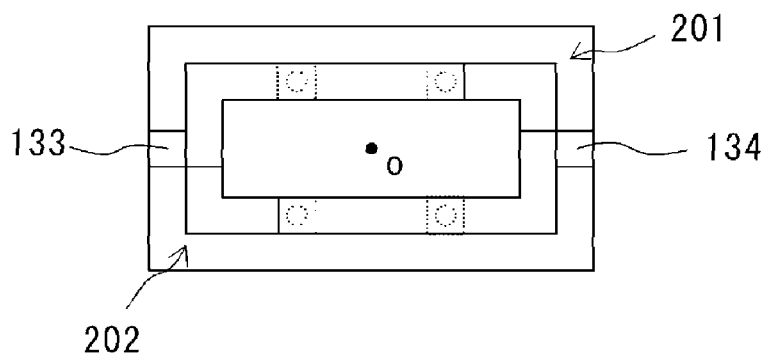

FIGS. 4A-4C are plan views showing a configuration of helical electrodes when the dielectric layers 103, 104, and 105 shown in FIG. 2 are laminated.

FIGS. 4A and 4B show two helical electrodes 201 and 202, respectively.

As shown in FIG. 4A, one end of the substantially linear line electrode 131a is connected to the ground electrode at the lower layer through the via electrode 161a, whereas the other end of the substantially linear line electrode 131a is connected to one end of the substantially U-shaped line electrode 131b through the via electrode 161b. In addition, the other end of the substantially U-shaped line electrode 131b is connected to one end of the substantially crank-shaped line electrode 131c through the via electrode 161c. The other end of the substantially crank-shaped line electrode 131c is connected to the input/output terminal electrode 133.

The helical electrode 201 having a line passing through the center "o" as the central axis is defined by the line electrodes 131a, 131b, and 131c and the via electrodes 161a, 161b, and 161c in this manner.

Similarly, as shown in FIG. 4B, one end of the substantially linear line electrode 132a is connected to the ground electrode at the lower layer through the via electrode 162a. The other end of the substantially linear line electrode 132a is connected to one end of the substantially U-shaped line electrode 132b through the via electrode 162b. The other end of the substantially U-shaped line electrode 132b is connected to one end of the substantially crank-shaped line electrode 132c through the via electrode 162c. The other end of the substantially crank-shaped line electrode 132c is connected to the input/output terminal electrode 134.

The helical electrode 202 having a line passing through the center "o" as the central axis is defined by the line electrodes 132a, 132b, and 132c and the via electrodes 162a, 162b, and 162c in this manner.

FIG. 4C is a plan view showing the two helical electrodes 201 and 202. The central axes of the two helical electrodes 201 and 202 are located at a position passing through the center "o". When positions of the two input/output terminal electrodes 133 and 134 are set as starting points, winding directions of the two helical electrodes 201 and 202 are the same (in this example, clockwise).

In this manner, the two helical electrodes 201 and 202 are constructed to have a double helix structure in the multilayer substrate 10.

Each line electrode disposed on each of the dielectric layers 103, 104, and 105 is arranged to be rotationally symmetric to the central axis passing through the center "O".

With such a configuration, each line electrode is evenly distributed with respect to the central axis "o" and the electrodes neighboring in the lamination direction of the dielectric layers have different shapes and do not overlap concentratedly. Accordingly, swelling of the multilayer substrate due to concentration of the electrodes in plan view can be advantageously prevented.

Figure 5:
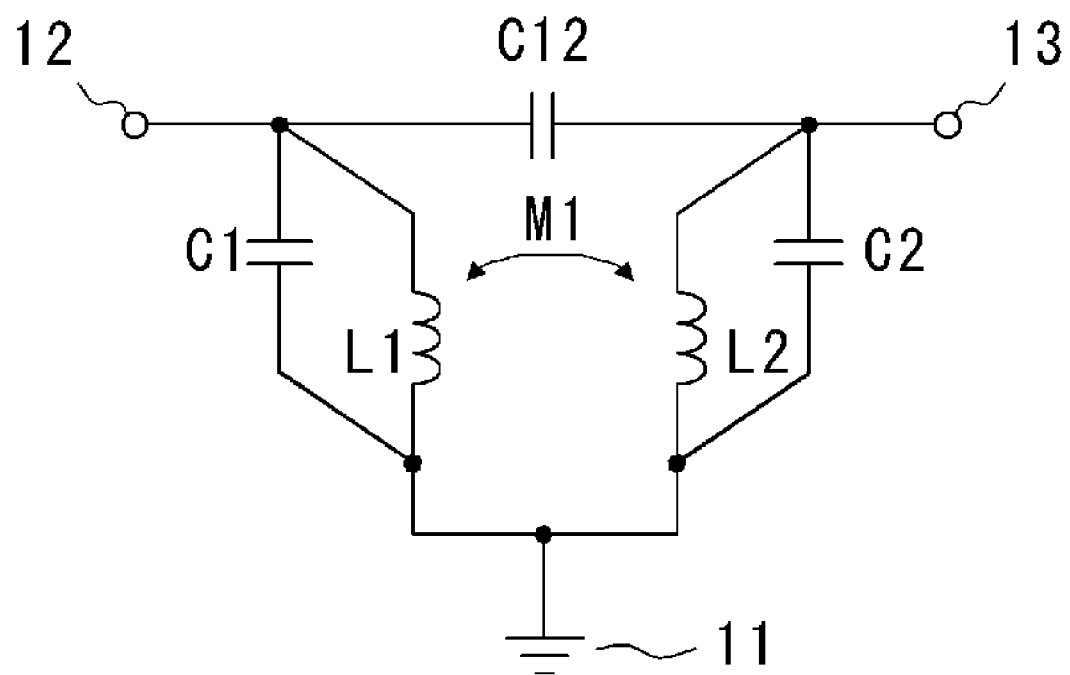
FIG. 5 shows an equivalent circuit of a multilayer bandpass filter according to a first preferred embodiment of the present invention.

FIG. 5 shows an equivalent circuit of the multilayer bandpass filter according to the first preferred embodiment.

Capacitors C1 and C2 are capacitance generated between the capacitor electrode 111 and the ground electrode 120 and between the capacitor electrode 112 and the ground electrode 120, respectively. Inductors L1 and L2 are inductance generated by the helical electrodes 201 and 202, respectively. A capacitor C12 is capacitance generated between the line electrodes 131c and 132c and the capacitor electrode 140 and capacitance generated at a gap between the capacitor electrodes 111 and 112. Mutual inductance M1 is generated by magnetic coupling in closed magnetic circuits defined by the helical electrodes 201 and 202.

As described above, the following circuit is provided. More specifically, a parallel circuit of the capacitor C1 and the inductor L1 is connected between the input/output terminal 12 and the ground terminal 11. A parallel circuit of the capacitor C2 and the inductor L2 is connected between the input/output terminal 13 and the ground terminal 11. The inductors L1 and L2 are magnetically coupled. The capacitor C12 is connected between the input/output terminals 12 and 13.

Such a configuration allows the above-described circuit to function as a bandpass filter including two coupled resonators.

Since second and following preferred embodiments preferably have an equivalent circuit that is the same as the equivalent circuit shown in FIG. 5, this diagram is commonly used in each of the second and following preferred embodiments.

According to the configuration described above, an occupied area can be reduced by overlapping arrangement areas of the helical electrodes 201 and 202 constituting the two inductors L1 and L2 as shown in FIGS. 4A-4C and the entire size can be reduced without decreasing a Q-value of a resonator. That is, the Q-value for the size of the resonator can be increased.

Since the two helical electrodes 201 and 202 have a double helix structure, a gap between respective line electrodes is reduced and closed circuits of the two inductors are shared, which thus provides large mutual inductance.

Furthermore, since electrodes having a small potential difference are neighboring each other in the same plane, parasitic capacitance between the line electrodes of the helical electrodes can be suppressed and minimized. More specifically, the helical electrode is a line electrode, one end of which is connected to the ground electrode and the other end of which is short-circuited. Since the helical electrodes provided on the same plane or the neighboring layers have substantially the same potential difference with respect to the ground electrode, the potential difference therebetween becomes small.

With such a configuration, a settable range of coupling of the two inductors broadens and design flexibility improves.

According to the configuration shown in FIG. 2, the dielectric layers 103, 104, and 105 constituting the helical electrodes 201 and 202 (see FIGS. 4A-4C) are sandwiched by the dielectric layer 102 having the ground electrode 120 provided thereon and the dielectric layer 106 having the capacitor electrode 140 provided thereon. The ground electrode 120 and the capacitor electrode 140 extend over a range of formation areas of the line electrodes 131a, 131b, 131c, 132a, 132b, and 132c. Accordingly, spreading of magnetic flux due to the helical electrodes 201 and 202 (inductors L1 and L2) can be suppressed ad minimized, and interference caused by a circuit provided on a mounting-board side and unnecessary magnetic coupling can be prevented.

Second Preferred Embodiment

Figure 6:
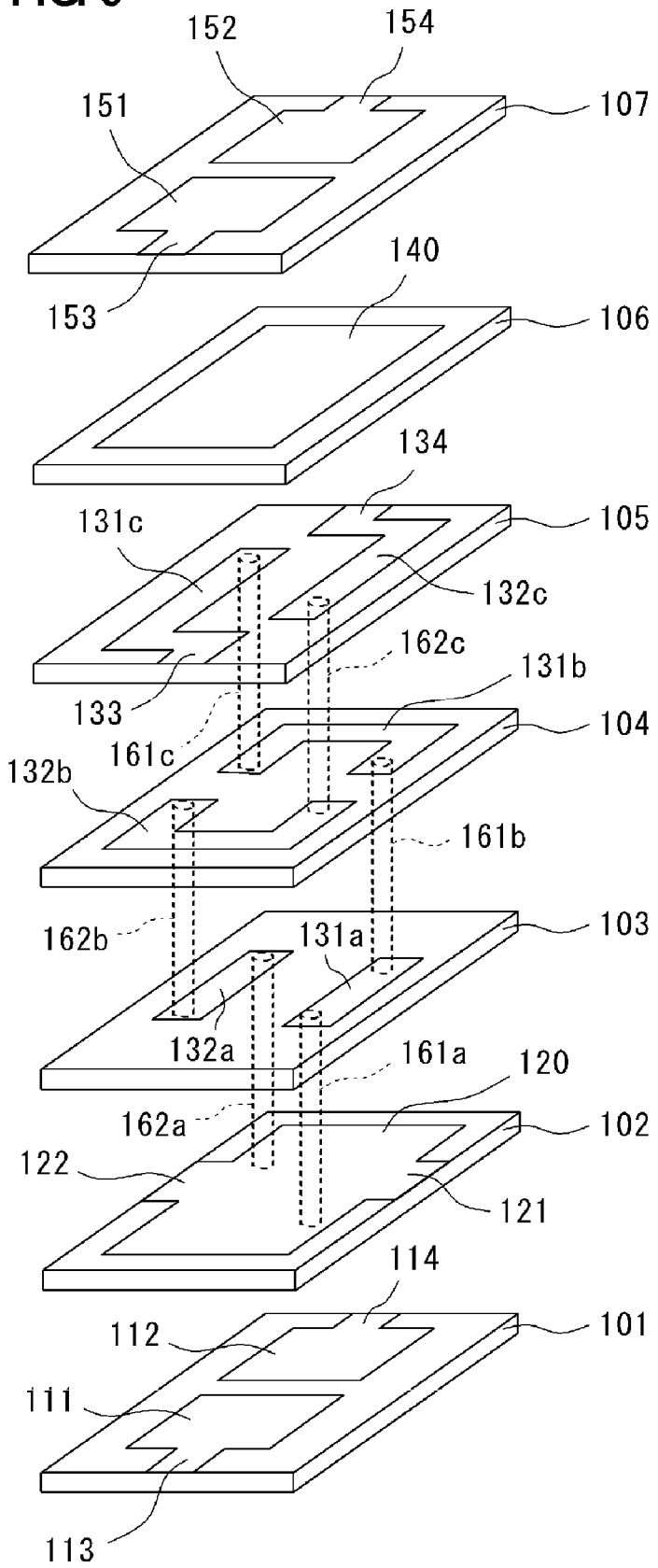
FIG. 6 is an exploded perspective view of a multilayer bandpass filter according to a second preferred embodiment of the present invention.

FIG. 6 is an exploded perspective view of a multilayer bandpass filter according to a second preferred embodiment. A difference from the multilayer bandpass filter according to the first preferred embodiment shown in FIG. 2 is that the multilayer bandpass filter according to the second preferred embodiment further includes a dielectric layer 107.

Capacitor electrodes 151 and 152 and input/output terminal electrodes 153 and 154 extending from the capacitor electrodes 151 and 152, respectively, are provided on the dielectric layer 107.

Capacitance is generated between the capacitor electrodes 151 and 152 and the capacitor electrode 140 provided on the dielectric layer 106. The input/output terminal electrodes 153 and 154 as well as the input/output terminal electrodes 113 and 114 provided on the dielectric layer 101 are connected to the input/output terminals 12 and 13 shown in FIG. 3, respectively. Accordingly, capacitance generated between the capacitor electrodes 151 and 152 and the capacitor electrode 140 is inserted between the input/output terminals. Thus, larger capacitance can be set for the capacitor C12 although an equivalent circuit of this multilayer bandpass filter is the same as that shown in FIG. 5.

Third Preferred Embodiment

Figure 7:
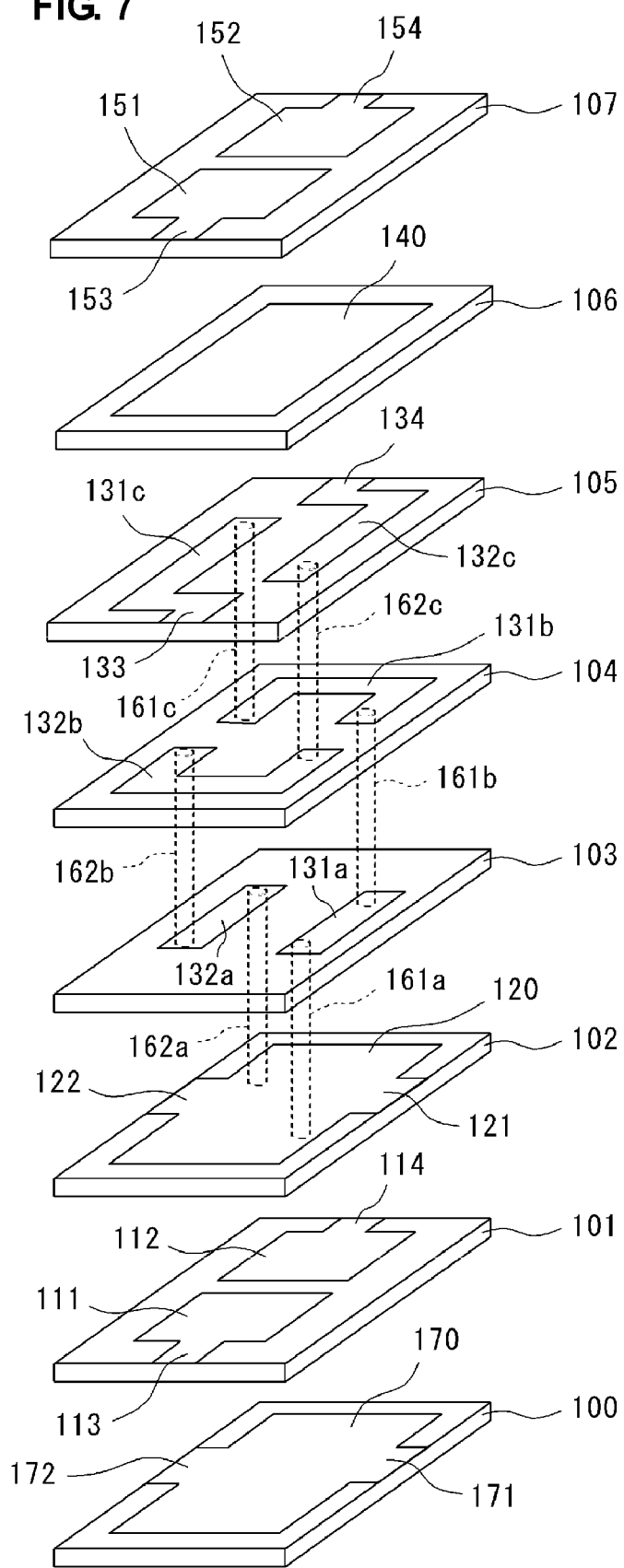
FIG. 7 is an exploded perspective view of a multilayer bandpass filter according to a third preferred embodiment of the present invention.

FIG. 7 is an exploded perspective view of a multilayer bandpass filter according to a third preferred embodiment. A difference from the configuration of the multilayer bandpass filter shown in FIG. 6 is that the multilayer bandpass filter according to the third preferred embodiment further includes a dielectric layer 100.

A ground electrode 170 and ground terminal electrodes 171 and 172 extending from the ground electrode 170 are provided on the dielectric layer 100.

The ground terminal electrodes 171 and 172 of the ground electrode 170 as well as the ground terminal electrodes 121 and 122 provided on the dielectric layer 102 are connected to the ground terminals 11 and 11, respectively. Accordingly, capacitance is generated between the capacitor electrodes 111 and 112 and the ground electrodes 120 and 170. The capacitance corresponds to the capacitors C1 and C2 of the equivalent circuit shown in FIG. 5 and sets a resonant frequency of an LC resonator.

In particular, since the configuration shown in FIG. 7 includes the ground electrode 170 on a mounting-surface side of a mounting board, interference from a circuit on the mounting-board side can be suppressed and minimized.

Fourth Preferred Embodiment

Figure 8:
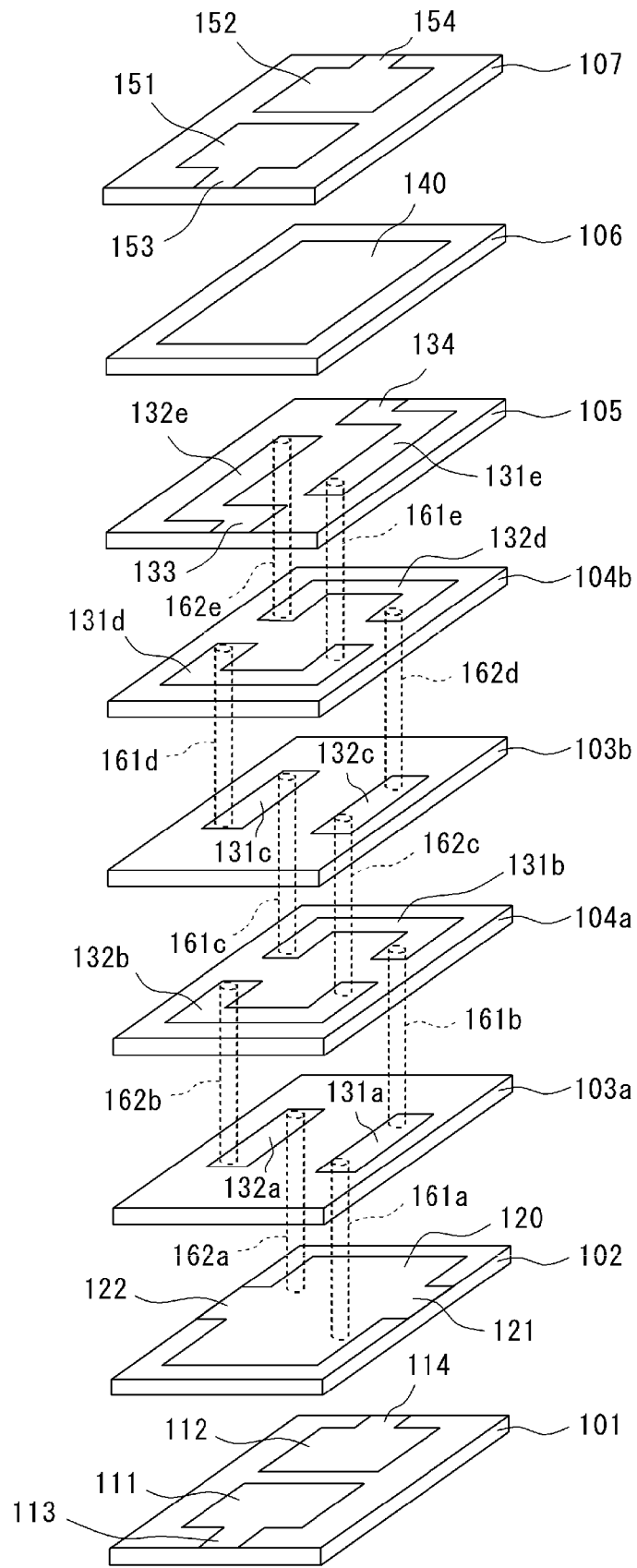
FIG. 8 is an exploded perspective view of a multilayer bandpass filter according to a fourth preferred embodiment of the present invention.

FIG. 8 is an exploded perspective view of a multilayer bandpass filter according to a fourth preferred embodiment. In this example, line electrodes and via electrodes are provided on each of five dielectric layers 103a, 104a, 103b, 104b, and 105 to define two helical electrodes.

More specifically, substantially linear line electrodes 131a and 132a are provided on the dielectric layer 103a. Substantially U-shaped line electrodes 131b and 132b are provided on the dielectric layer 104a. Substantially linear line electrodes 131c and 132c are provided on the dielectric layer 103b. Substantially U-shaped line electrodes 131d and 132d are provided on the dielectric layer 104b. Substantially crank-shaped or L-shaped line electrodes 131e and 132e are provided on the dielectric layer 105. Via electrodes 161a and 162b arranged to connect one ends of the line electrodes 131a and 132 and the ground electrode 120, respectively, are provided on the dielectric layer 103a. Via electrodes 161b and 162b arranged to connect the other ends of the line electrodes 131a and 132a and one ends of the line electrodes 131b and 132b, respectively, are provided on the dielectric layer 104a. Via electrodes 161c and 162c arranged to connect one ends of the line electrodes 131c and 132c and the other ends of the substantially U-shaped line electrodes 131b and 132b, respectively, are provided on the dielectric layer 103b. Via electrodes 161d and 162d arranged to connect the other ends of the line electrodes 131c and 132c and one ends of the line electrodes 131d and 132d, respectively, are disposed on the dielectric layer 104b. Via electrodes 161e and 162e arranged to connect the other ends of the line electrodes 131d and 132d and one ends of the line electrodes 131e and 132e, respectively, are provided on the dielectric layer 105.

The other configuration is substantially the same as that of the multilayer bandpass filter shown in FIG. 6.

By repeatedly providing substantially linear line electrodes (131a, 132a, 132c, and 131c), substantially U-shaped line electrodes (131b, 132b, 131d, and 132d), and via electrodes connecting the substantially liner line electrodes and the substantially U-shaped line electrodes (161b, 162b, 161c, 162c, 161d, 162d, 161e, and 162e), helical electrodes having many windings can be provided. With such a configuration, larger inductance values can be set for the inductors L1 and L2 of the equivalent circuit shown in FIG. 5.

Fifth Preferred Embodiment

Figure 9:
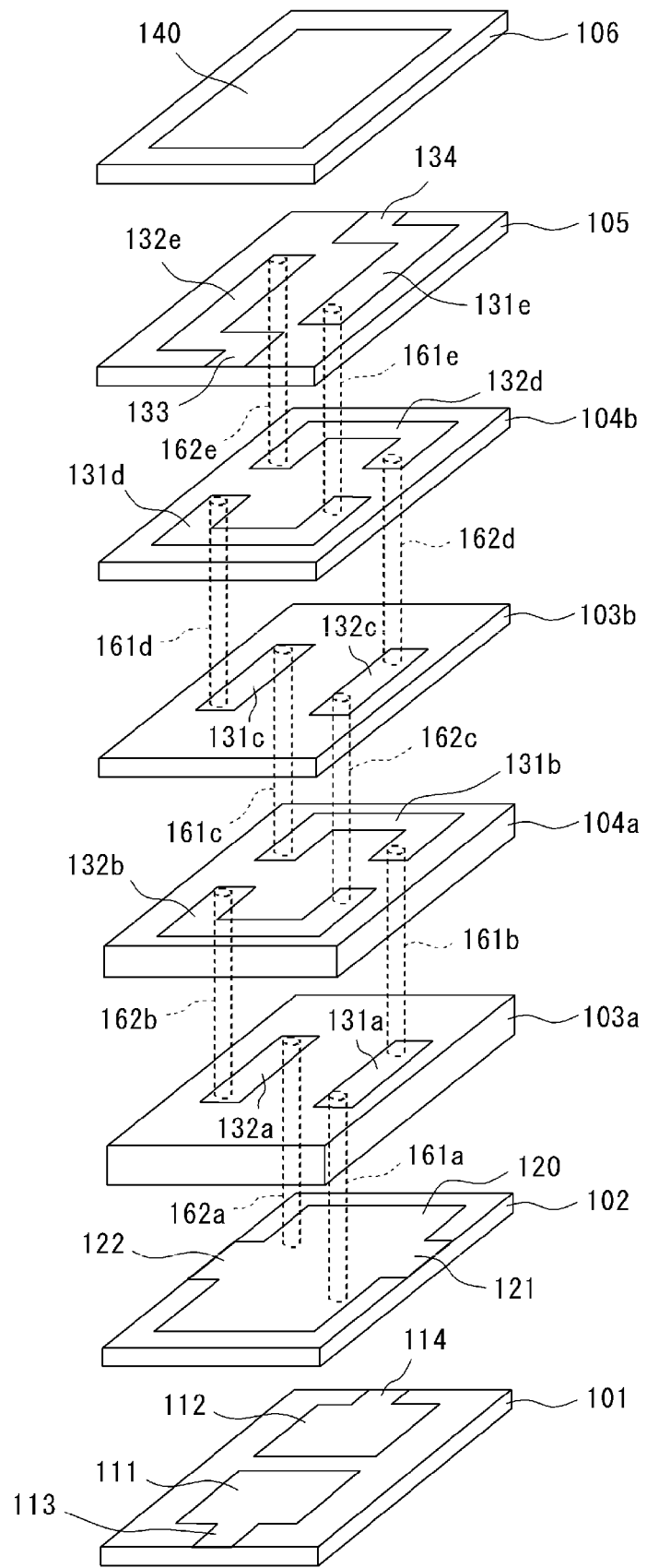
FIG. 9 is an exploded perspective view of a multilayer bandpass filter according to a fifth preferred embodiment of the present invention.

FIG. 9 is an exploded perspective view of a multilayer bandpass filter according to a fifth preferred embodiment. A difference from the multilayer bandpass filter shown in FIG. 8 is in the thickness of the dielectric layers 103a and 104a. In this example, the dielectric layers 103a and 104a is preferably thicker than the other dielectric layers 103b, 104b, and 105 having line electrodes formed thereon. With such a configuration, since the length of the via electrodes 161a and 162a provided on the dielectric layer 103a is increased (a gap between a major portion of helical electrodes and the ground electrode 120 broadens) and electromagnetic coupling between an inductor and the ground electrode can be suppressed and minimized, a Q-value of a resonator is increased.

In addition, by increasing the thickness of a plurality of dielectric layers constituting the helical electrodes (in this example, the thickness of the dielectric layers 103a and 104a are increased), the length of the via electrodes provided on the dielectric layers is increased. By reducing the length of the line electrodes by the increased amount of the via electrodes, a ratio of an area having a large line cross section increases and an inductor having a high Q-value can be obtained.

Any methods, such as a method for changing thickness of each of dielectric layers to be used and a method for laminating a predetermined number of dielectric layers having the same thickness, may be used as a method for changing the thickness of the dielectric layers.

In each of the preferred embodiments described above, all of the line electrodes (131a, 132a, 131b, 132b, 131c, and 132c) constituting a portion of the helical electrodes are represented to have the same line width. However, for example, by making the width of the line electrodes 131b and 132b shown in FIGS. 2, 6, and 7 thinner than the width of the line electrodes 131a, 132a, 131c, and 132c, i.e., by arranging the line electrodes in an order of "the thick line", "the thin line", "the thick line", . . . in the lamination direction, an overlapping portion (area) of the line electrodes hardly changes in a plan view even if horizontal lamination displacement of the dielectric layers 103, 104, and 105 is caused. Thus, characteristic variance due to the lamination displacement of dielectric layers can be suppressed and minimized.

In addition, in each of the above-described preferred embodiments, the central axes of the two helical electrodes 201 and 202 are set to match, for example, as shown in FIGS. 4A-4C. However, the central axes of the two helical electrodes 201 and 202 may be shifted in a surface direction of the dielectric layers as long as one helical electrode overlaps the other helical electrode at least partially when the multilayer substrate is viewed in the lamination direction.

In addition, although a filter having a bandpass characteristic due to coupling of two LC resonators is formed in each of the above-described preferred embodiments, the present invention can be similarly applied to an LC composite component including an LC resonant circuit. The LC resonant circuit includes two inductors whose one ends are connected to input/output terminal electrodes and a capacitor whose one end is connected to the input/output terminal electrodes.

Sixth Preferred Embodiment

Figure 10:
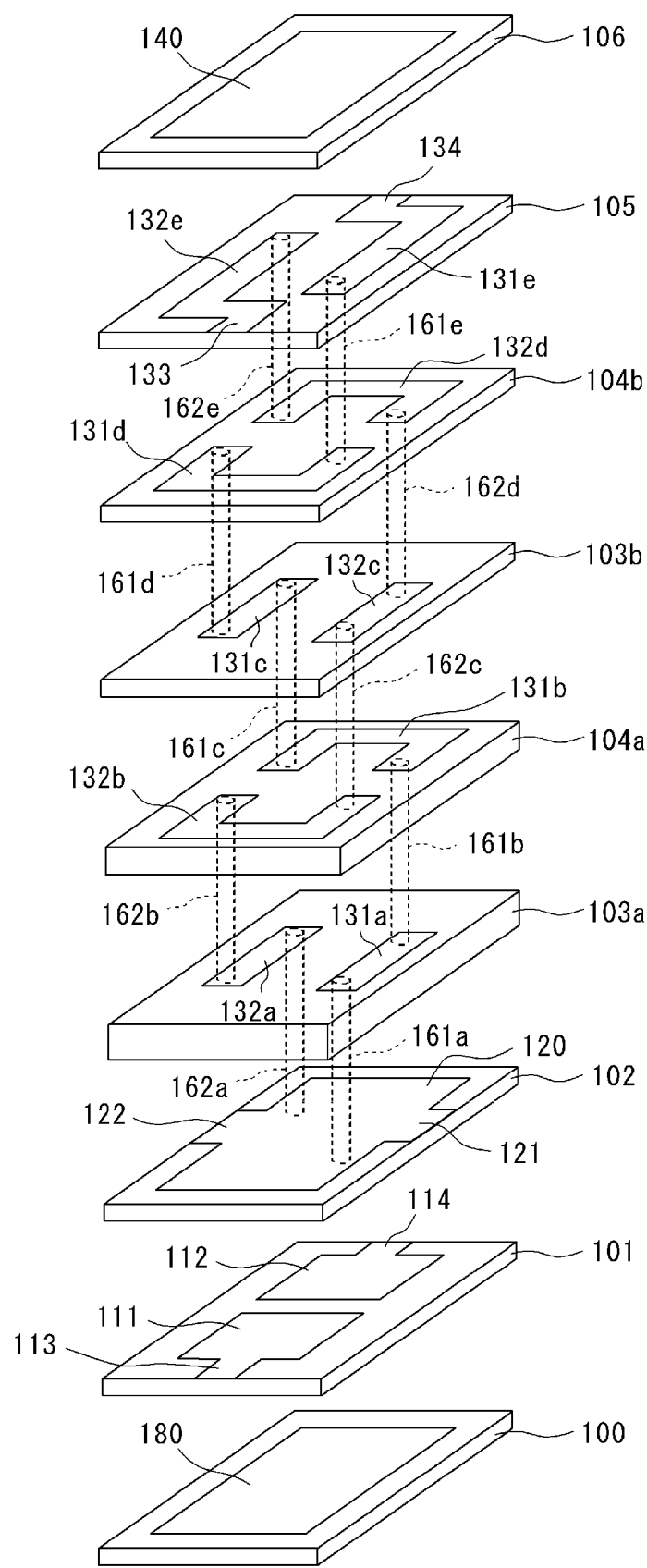
FIG. 10 is an exploded perspective view of a multilayer bandpass filter according to a sixth preferred embodiment of the present invention.

FIG. 10 is an exploded perspective view of a multilayer bandpass filter according to a sixth preferred embodiment. A difference from the multilayer bandpass filter shown in FIG. 9 is that the multilayer bandpass filter according to the sixth preferred embodiment includes a dielectric layer 100, on which a capacitor electrode 180 is disposed.

With such a configuration, capacitance is generated between the capacitor electrodes 111 and 112 and the capacitor electrode 180. This capacitance corresponds to the capacitor C12 shown in FIG. 5. Accordingly, a capacitance value of the capacitor C12 can be set by thickness of the dielectric layer 101.

In addition, by inserting another dielectric layer between the dielectric layers 100 and 101, the capacitance value of the capacitor C12 can be set by thickness of the inserted dielectric layer or the number of dielectric layers to be inserted. Accordingly, flexibility of designing a filter characteristic can be further increased.

Figure 11:
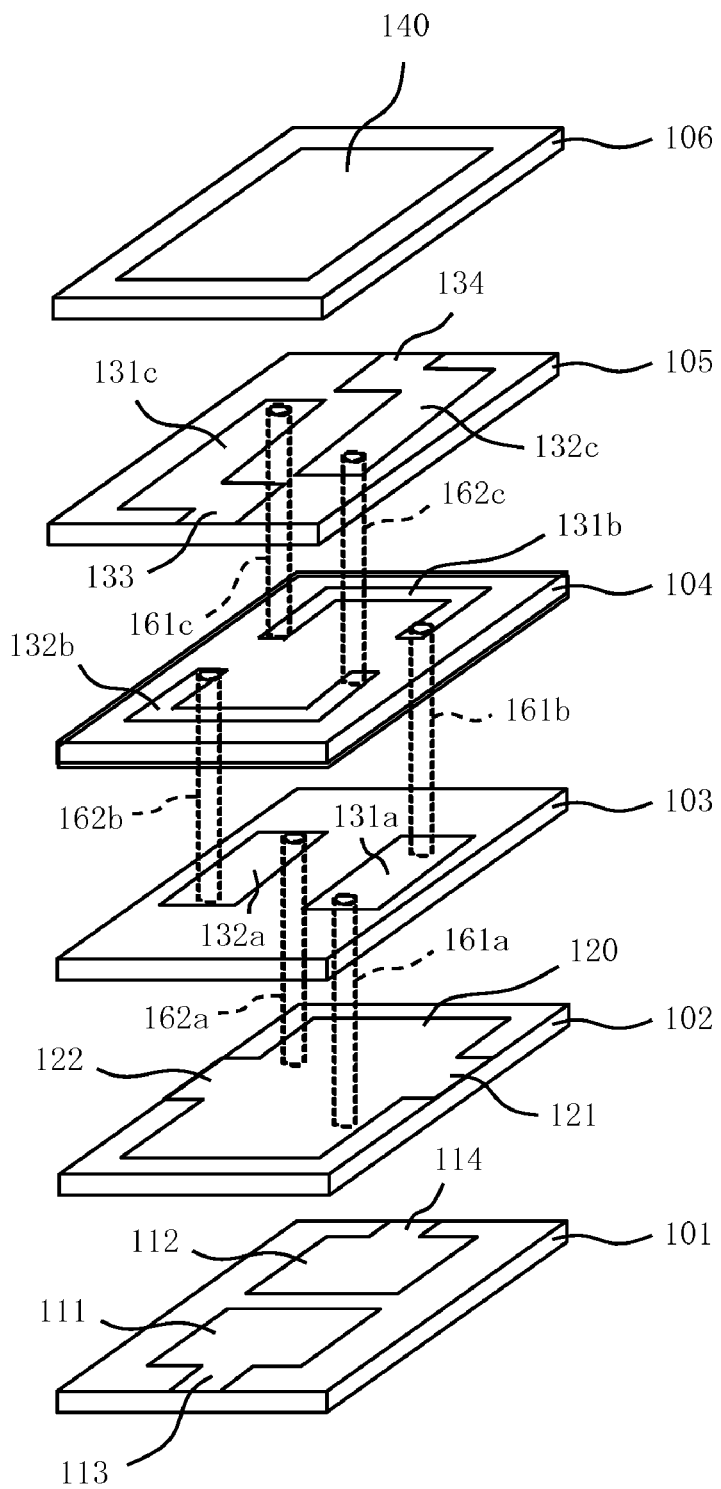
FIG. 11 is an exploded perspective view of a multilayer bandpass filter according to a modification of the first preferred embodiment of the present invention.

FIG. 11 is an exploded perspective view of a multilayer bandpass filter according to a modification of the first preferred embodiment. A difference from the multilayer bandpass filter shown in FIG. 2 is that the multilayer bandpass filter according to the modification of the first preferred embodiment includes line electrodes 131*b* and 132*b* that have widths that are different from the widths of the lines electrodes 131*a*, 132*a*, 131*c*, and 132*c*.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC composite component comprising:
   a multilayer substrate including a plurality of dielectric layers;
   at least two input/output terminal electrodes provided in the multilayer substrate;
   a ground terminal electrode provided in the multilayer substrate; and
   an LC resonant circuit provided in the multilayer substrate, the LC resonant circuit including two inductors including first ends that are connected to respective ones of the at least two input/output terminal electrodes and a capacitor including a first end that is connected to one of the at least two input/output terminal electrodes; wherein
   the two inductors include line electrodes provided on the plurality of dielectric layers of the multilayer substrate and via electrodes arranged to connect neighboring ones of the line electrodes in a lamination direction of the plurality of dielectric layers, and are defined by two helical electrodes that have a central axis extending in the lamination direction;
   the two helical electrodes are arranged so that one of the helical electrodes overlaps the other helical electrode at least partially when the multilayer substrate is viewed in the lamination direction; and
   at least one of the line electrodes of one of the two inductors and at least one of the line electrodes of the other of the two inductors are provided on a common dielectric layer of the plurality of dielectric layers.

2. The component according to claim 1, wherein the central axis of a helix of the one of the helical electrodes and the central axis of a helix of the other helical electrode are located at substantially the same position.

3. The component according to claim 1, wherein winding directions of the two helical electrodes are the same when positions of the at least two input/output terminal electrodes are set as starting points.

4. The component according to claim 1, wherein the line electrodes that define a portion of the two helical electrodes formed on the plurality of dielectric layers of the multilayer substrate are arranged to be rotationally symmetrical to the central axis in each layer.

5. The component according to claim 1, wherein a ground electrode to be connected to the ground terminal electrode is provided in the multilayer substrate and the other ends of the two helical electrodes are connected to the same ground electrode.

6. The component according to claim 1, wherein the capacitor includes a capacitor electrode that extends over at least a major portion of a formation area of the helical electrodes when the multilayer substrate is viewed in the lamination direction, and the capacitor electrode and the ground electrode are arranged to sandwich the helical electrodes in the lamination direction.

7. The component according to claim 1, wherein the capacitor is connected in series with the at least two input/output terminal electrodes, and an electrode defining the capacitor is provided at a highest layer and/or a lowest layer of the plurality of dielectric layers of the multilayer substrate in the lamination direction.

8. The component according to claim 1, wherein the two helical electrodes include partial electrodes provided on at least two of the plurality of dielectric layers of the multilayer substrate, and widths of the partial electrodes neighboring each other in the lamination direction of the multilayer substrate differ.

9. The component according to claim 1, wherein a thickness of at least one of the plurality of dielectric layers that includes the via electrodes defining a portion of the helical electrodes provided thereon is thicker than a thickness of other dielectric layers of the plurality of dielectric layer that does not include the via electrodes provided thereon.

10. The component according to claim 1, wherein a thickness of a dielectric layer of the plurality of dielectric layers that includes a via electrode to be connected to the ground electrode among the via electrodes that define a portion of the helical electrodes is thicker than a thickness of a dielectric layer of the plurality of dielectric layers that includes the other via electrodes provided thereon.

* * * * *